United States Patent [19]

Slough

[11] 4,409,080
[45] Oct. 11, 1983

[54] SYSTEM FOR MONITORING A CATHODICALLY PROTECTED STRUCTURE

[75] Inventor: Carlton M. Slough, Spring, Tex.

[73] Assignee: Texaco Inc., White Plains, N.Y.

[21] Appl. No.: 274,856

[22] Filed: Jun. 18, 1981

[51] Int. Cl.³ ............................................ C23F 13/00
[52] U.S. Cl. .................................. 204/196; 204/147; 204/404
[58] Field of Search ............... 204/147, 148, 196, 197, 204/1 T, 195 C, 195 R

[56] References Cited

U.S. PATENT DOCUMENTS

| | | | |
|---|---|---|---|
| 2,803,797 | 8/1957 | Cowles | 204/196 |
| 2,943,027 | 6/1960 | Schaschl et al. | 204/195 C |
| 3,066,082 | 11/1962 | Marsh et al. | 204/195 C |
| 3,209,255 | 9/1965 | Estes et al. | 324/94 |
| 3,351,545 | 11/1967 | Heuze | 204/196 |
| 3,461,042 | 8/1969 | Martin et al. | 204/195 T |
| 3,649,492 | 3/1972 | Marsh et al. | 204/196 |
| 3,665,308 | 5/1972 | Beusman | 324/182 |
| 3,696,365 | 10/1972 | Ward | 204/196 |
| 3,915,810 | 10/1975 | Dahms | 204/195 R |
| 4,080,565 | 3/1978 | Polak et al. | 204/196 |
| 4,130,464 | 12/1978 | Kanno et al. | 204/195 C |
| 4,155,814 | 5/1979 | Tejfalussy et al. | 204/195 C |

Primary Examiner—T. Tung
Attorney, Agent, or Firm—Carl G. Ries; Robert A. Kulason; Henry C. Dearborn

[57] ABSTRACT

A corrosion monitoring system for measuring cathodic protection current flow. It is applicable to a buried structure that has cathodic protection applied to it. The monitoring system includes a microcoulometer connected between the buried structure and a small target electrode of a predetermined size.

2 Claims, 1 Drawing Figure

U.S. Patent    Oct. 11, 1983    4,409,080
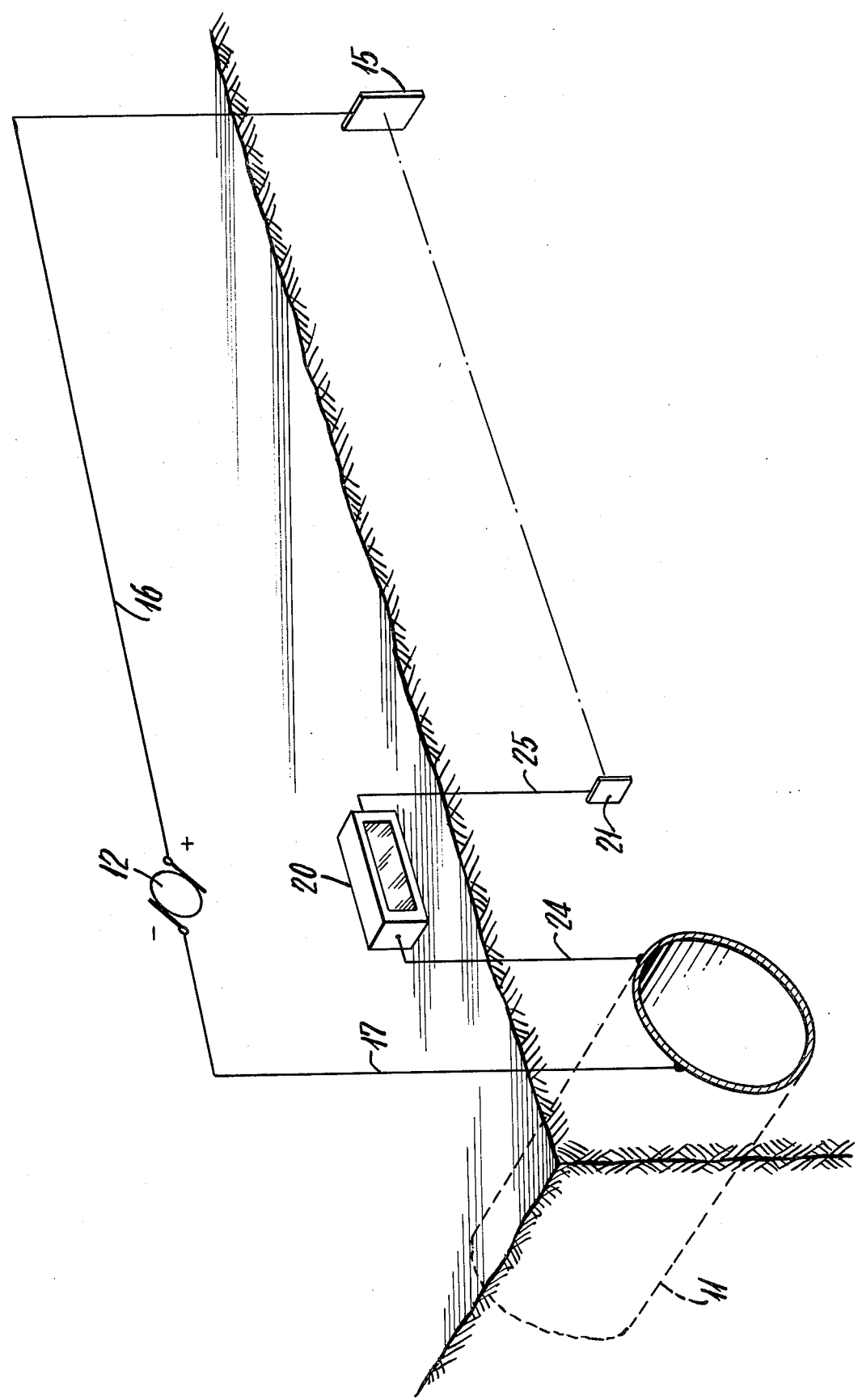

SYSTEM FOR MONITORING A CATHODICALLY PROTECTED STRUCTURE

BACKGROUND OF THE INVENTION

1. Field of the Invention

This invention concerns corrosion monitoring, in general. More specifically, it relates to a system for monitoring the effectiveness of a buried structure that is under cathodic protection for reducing corrosion.

2. Description of the Prior Art

Heretofore, there have been various proposals for making measurements or determinations relating to the rate of corrosion of a metal object or the like that is subjected to corrosive conditions. Thus, there are U.S. Pats. such as those to Marsh et al, No. 3,066,082, Nov. 27, 1962; Estes et al, No. 3,209,255, Sept. 28, 1965; Kanno et al, No. 4,130,464, Dec. 19, 1978; and Tejfalussy et al, No. 4,155,814, May 22, 1979.

The Marsh et al patent does deal with determining conditions of protective coatings on a pipeline. However, it makes use of a specimen pipe that must be as similar as possible to a corresponding section of the pipeline. And, in addition, the specimen is separate and is electrically unconnected to the pipeline which is done in order to avoid complications relating to cathodic protection currents to which the pipeline is subjected. The applicant's invention, on the other hand, is a simple system that makes use of the cathodic protection current flow itself. And, it measures the quantity of current over an extended period of time in order to determine the effectiveness of the protection at a given location on a pipeline.

The Estes et al patent merely discloses a particular type of current integrator. It employs a fritted disc in order to obtain osmotic current flow, and it basically acts as a coulometer per se which may be used in various ways.

The Kanno et al patent deals with a relatively complicated electronic circuit arrangement for evaluating corrosion rates of metals and, consequently, is not relevant to the applicant's invention.

The Tejfalussy et al patent provides for setting up a galvanic action circuit arrangement. And, it employs a plurality of electrodes situated near a metallic object that is to have the corrosion investigation thereof carried out.

Thus, it is an object of this invention to provide a relatively simple yet highly effective system for monitoring the current flow that relates to a buried structure which is under cathodic protection.

SUMMARY OF THE INVENTION

Briefly, the invention concerns a system for monitoring a buried structure having cathodic corrosion protection applied thereto. It comprises a coulometer, and a target electrode buried adjacent to said structure. It also comprises circuit means for connecting said coulometer between said structure and said target electrode whereby said cathodic corrosion protection current density may be measured.

Again briefly, the invention concerns a system having a buried structure that is subject to galvanic corrosion. The said structure is under cathodic protection which comprises an anode and a DC power supply connected between said structure and said anode for counteracting said galvanic corrosion. The invention concerns means for monitoring the quantity of current flow between said anode and structure, and it comprises a target electrode buried adjacent to said structure, plus a microcoulometer and low resistance circuit means for connecting said microcoulometer between said target electrode and said structure.

BRIEF DESCRIPTION OF THE DRAWING

The foregoing and other objects and benefits of the invention will be more fully set forth below in connection with the best mode contemplated by the inventor of carrying out the invention, and in connection with which there are illustrations provided in the drawing, wherein:

The FIGURE of drawing is a schematic perspective indicating a pipeline that is under cathodic protection and with the invention applied thereto.

DESCRIPTION OF THE PREFERRED EMBODIMENT

In connection with various pipelines and other buried metal structures where there is a cathodic protection system in operation, it is helpful to have some determination concerning the effectiveness of such protection. A cathodic protection system makes use of a DC power supply and includes a buried anode system. It causes current flow through the earth to the protected structure. When such cathodic protection is applied to a long pipeline, there are occasionally sections which suffer high corrosion rates and consequent rapid failure. And, by making use of a system according to this invention, such a location may be monitored to determine whether the cathodic protection system is functioning properly.

Thus, with reference to the drawing FIGURE it will be noted that there is shown a buried pipeline 11 that is under cathodic protection. It has a DC power supply 12 electrically connected between an anode 15 and the pipeline 11. The electrical connection may be carried out by any feasible circuit connections, e.g. a circuit connection 16 that goes from the anode 15 to the positive terminal of the DC power supply 12. Similarly, there is another circuit connection 17 that goes between the negative terminal of the power supply 12 and the pipeline 11.

It has been determined that current densities which are required for protection of steel pipe will vary depending upon the protective coating in a range of several milliamperes per square foot, for bare steel, to a few microamperes or less for very well coated steel. And, of course, if the current density is known, it gives an indication that may be used in determining whether the cathodic protection being supplied is adequate.

In order to monitor the current flow that is taking place due to the cathodic protection system described above, a system according to this invention may be employed. It makes use of a coulometer 20 that is connected between the pipeline 11 and a target electrode 21. Target electrode 21 is buried adjacent to the pipeline 11, and is between the pipeline and the anode 15 that is providing the cathodic protection current.

The coulometer 20 may take various forms, but preferably it is a microcoulometer instrument. And, it may be like one manufactured by Curtis Instruments, Inc. of 200 Kisco Avenue, Mount Kisco, New York 10549. Such an instrument has a precision capillary tube (not shown) that is filled with two columns of mercury separated by an indicating gap of electrolyte. When direct current passes through the mercury column, the mercury plates from one column to the other at a rate that is governed by precise electro-chemical principles and, consequently, the gap moves along a scale and indicates the current-time integral. Structural details of such a coulometer are shown and described in a U.S. Pat. No. 3,665,308 issued May 23, 1972.

The target electrode 21 is made of a simple steel probe that has suitable surface area for a particular test to be made. It is inserted in the earth adjacent to the pipeline 11, and it intercepts some of the cathodic current so that the measurement it makes is a determination related to the current per square foot. Furthermore, because of the large difference in surface area between the pipeline 11 and the target electrode 21, the location of the target relative to the pipeline is not particularly critical. However, it is preferred that the target 21 should be located between one foot and fifteen feet from the pipeline 11. The exact location to be largely determined by the convenience in connection with burying the target 21.

It will be noted that there are low resistance circuit connections 24 and 25 that connect the pipeline 11 and the target electrode 21, respectively, with the coulometer 20. It will be appreciated that the physical connections to the pipeline 11 and to the target electrode 21 may be made in any convenient manner which will provide a low resistance electrical connection.

As an example of the size of the current measurement which may be carried out by the system, it may be noted that if the system is to provide one milliampere of current per square foot to the pipeline 11 and the surface area of the target 21 is 0.01 square feet, then the target current (being measured by the coulometer 20) should be 10 microamperes.

Since the microcoulometer 20 provides a current-time integral measurement, the scale reading after a known operating time may be converted to current density which may then be related to corrosion protection.

It may be noted that there are nominal current densities for steel pipe corrosion protection, as was noted above. A table indicating such nominal current densities follows:

| CONDITIONS | CURRENT REQUIRED MILLIAMPERES PER SQUARE FOOT |
| --- | --- |
| Bare steel in earth | 1-3 |
| Poorly coated steel | 0.1 |
| Well coated steel | 0.003 |
| Very well coated steel | 0.0003 or less |

It will be clear that by making use of a simple system according to this invention, the conditions at any particular location of a pipeline that is under cathodic protection, may be monitored so as to determine whether the cathodic protection is effective. Such monitoring is carried out by the simple system that connects a microcoulometer to the pipeline between it and a buried target electrode which has a predetermined surface area. Then, the coulometric measurement is made over an extended time period and it will provide the desired monitoring determination. This arrangement permits an unattended monitoring operation over a long time period, and consequently the cost of such monitoring is quite minimal.

While a particular embodiment according to this invention has been described above in considerable detail in accordance with the applicable statute, this is not to be taken as in any way limiting the invention but merely as being descriptive thereof.

I claim:

1. In a system having a buried structure being subject to galvanic corrosion, said structure being under cathodic protection comprising an anode and a DC power supply connected between said structure and said anode for counteracting said galvanic corrosion, means for monitoring the quantity of current flow between said anode and structure, comprising a microcoulometer having a precision capillary tube with two columns of mercury separated by an indicating gap of electrolyte, a target electrode having a predetermined relatively small surface area, said target electrode being buried spaced from one to fifteen feet from said buried structure, and a low resistance conductor connecting each of said two columns of mercury with one of said buried structure and said target electrode, respectively.

2. In a system according to claim 1, wherein said structure is a pipeline.

* * * * *